June 19, 1962 C. O. FORGE 3,040,265
TRANSISTOR AMPLIFIERS HAVING LOW INPUT IMPEDANCE
Filed July 18, 1960
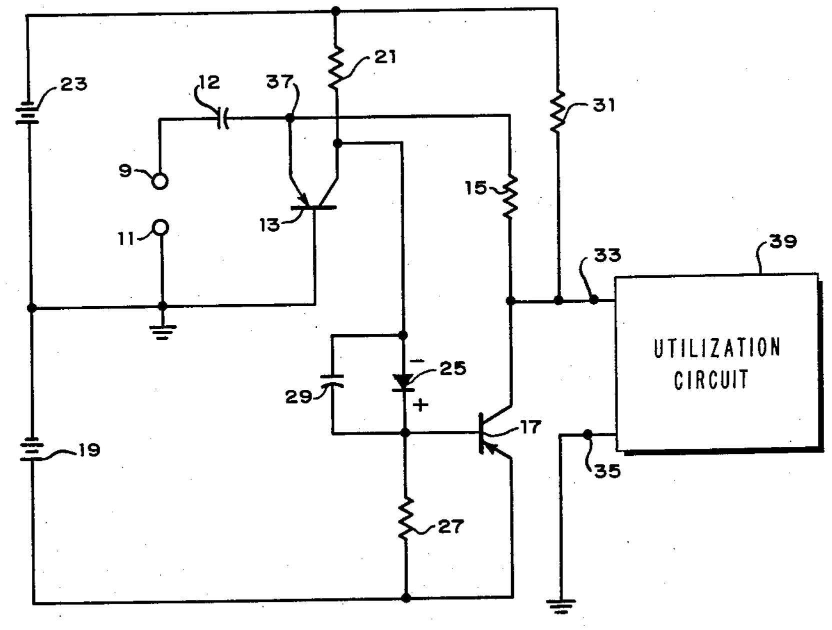
INVENTOR
CHARLES O. FORGE
BY J. I. Chapman
ATTORNEY United States Patent Office 3,040,265

Patented June 19, 1962

3,040,265
TRANSISTOR AMPLIFIERS HAVING LOW INPUT IMPEDANCE

Charles O. Forge, Cupertino, Calif., assignor to Hewlett-Packard Company, Palo Alto, Calif., a corporation of California Filed July 18, 1960, Ser. No. 43,676
9 Claims. (Cl. 330—28)

This invention relates to transistor amplifiers and more particularly to a temperature stabilized transistor amplifier which has very low input impedance.

An amplifier is frequently required in making small current measurements. By inserting an amplifier in a current-carrying conductor, or by positioning a current probe connected to an amplifier about a current-carrying conductor, it is possible to amplify the current to a level that can be easily metered. In order to make an accurate measurement without disturbing the circuit under test, the amplifier should have low input impedance. In addition, it is desirable to have the amplifier battery operated for portability and for relatively lower noise amplification. It is necessary, however, to design such an amplifier for low power consumption in order to obtain long battery life.

Therefore, it is an object of the present invention to provide a transistor amplifier which shows very low input impedance.

It is another object of the present invention to provide a transistor amplifier which is temperature compensated to permit stable operation over a wide range of ambient temperatures.

It is still another object of the present invention to provide a transistor amplifier which operates at substantially constant gain over a wide band of frequencies.

It is a further object of the present invention to provide an amplifier which has low power consumption suitable for battery operation.

In accordance with the illustrated embodiment of the present invention, low power consumption and stable operation are achieved by serially connecting two transistors of similar conductivity type in a negative feedback circuit. Very low input impedance is obtained by applying the input signal to the emitter of a common base transistor stage. In addition, negative feedback around the circuit further reduces the input and output impedances.

Other and incidental objects of the present invention will be apparent from a reading of this specification and an inspection of the accompanying drawing which shows a schematic diagram of an embodiment of the present invention.

Referring now to the drawing, there is shown input terminals 9 and 11. The emitter electrode of transistor 13 is connected to input terminal 9 through coupling capacitor 12 and is connected through resistor 15 to the collector electrode of transistor 17. The base electrode of transistor 13 is connected to the grounded input terminal 11. The collector electrode of transistor 13 is connected through resistor 21 to voltage supply 23 and is connected to voltage supply 19 through Zener diode 25 and resistor 27. The common terminal of serially connected voltage supplies 19 and 23 is connected to ground terminal 11. Zener diode 25 is shunted by capacitor 29. The emitter electrode of transistor 17 is connected to voltage supply 19 and the collector electrode of transistor 17 is connected to voltage supply 23 through resistor 31. Output terminal 33 is connected to the collector electrode of transistor 17 and output terminal 35 is connected to ground. A meter, or other utilization circuit 39, is connected to terminals 33 and 35.

The D.-C. operation of the circuit is as follows: the voltage that appears across resistor 21 is a substantially constant value equal to the voltage of the serially connected voltage sources 19 and 23 less the voltage drop across Zener diode 25 and the voltage across the base-emitter junction of transistor 17. Thus, a constant current flows through resistor 21 to the collector electrode of transistor 13. This collector current, in addition to the small amount of base current, flows from the emitter electrode of transistor 13 through resistor 15 to provide a portion of the bias current for transistor 17. Since transistor 17 operates at a higher signal level, it is necessary to introduce an additional amount of bias current through resistor 31. Both transistors, then, are effectively in series for the D.-C. biasing conditions since the bias current of transistor 13 constitutes a portion of the bias current of transistor 17. Thus, the total current supplied by the sources 19 and 23 is equal to the bias current of transistor 17. Resistor 27 is provided to shunt the reverse collector saturation current ($I_{co}$) of transistor 17 to ground, thereby preventing $I_{co}$ from reducing the bias current through Zener diode 25.

The D.-C. operating points of both ttransistors are stabilized by the negative feedback configuration of the circuit. For example, if $I_{co}$ increases as temperature increases and the base current of transistor 17 tends to increase, then the current drawn through resistor 15 will be $\beta$ times larger than the increase in the base current. This increase current through resistor 15 is drawn through the emitter electrode and through the collector electrode of transistor 13, thereby reducing the voltage appearing on the collector electrode. The reduced collector voltage tends to reduce the current flowing through resistor 27 which in turn reduces the current flowing in the base of transistor 17. Thus, the circuit is stabilized against variations in ambient temperature.

An alternating current signal from a current probe, for example, is applied to input terminals 9 and 11. The signal is coupled to the emitter electrode of transistor 13 and to the collector electrode of transistor 17 through capacitor 12. Since the collector signal is substantially equal to the emitter signal for a common base stage, the portion of the signal on the emitter of transistor 13 is then coupled through capacitor 29 to the base electrode of transistor 17. Transistor 17, operating as a common emitter stage, amplifies the signal applied to the base electrode by the current gain parameter, $\beta$, of the transistor. The amplified signal appears at the collector electrode of transistor 17. Resistor 15 provides a negative feedback path from the collector electrode of transistor 17 to the emitter electrode of transistor 13, thereby stabilizing the gain of the amplifier and reducing the input impedance. If, for example, one milliamp of signal current flows into node 37, approximately one milliamp tends to flow out of the collector of transistor 13 and into the base electrode of transistor 17. Transistor 17 then draws $\beta$ milliamps through resistor 15. The input current required to force one milliamp of current into the emitter of transistor 13, as found by adding the currents at node 37, is equal to $(1+\beta)$ milliamps. Therefore, for one milliamp of input current, a current of $(1/1+\beta)$ flows into the emitter electrode of transistor 13, the remaining current flows through resistor 15 into the collector of transistor 17. Since only a portion of the input current, $$\frac{1}{1+\beta}$$

flows into the emitter of transistor 13, the voltage swing and therefore the impedance level at input terminal 9 is reduced by a factor of $$\frac{1}{1+\beta}$$

The negative feedback configuration in the illustrated embodiment of the present invention, also serves to reduce the output impedance, increase the bandwidth, and improve the distortion characteristics of the amplifier. The large amount of feedback in the circuit causes the current through resistor 15 to be substantially equal to the input current. The output voltage is related to the input current by the value of resistor 15, thereby insuring that the circuit operates at relatively low values of distortion. The gain (i.e. ratio of the output voltage to the input current) of the amplifier is substantially equal to the value of resistor 15.

I claim:

1. A semiconductor amplifier circuit comprising a first transistor of one conductivity type connected in the common base configuration and including first base, collector, and emitter electrodes, a second transistor of similar conductivity type connected in the common emitter configuration and including second base, collector, and emitter electrodes, a point of reference potential, first and second direct current power supplies having output terminals, means connecting said first base and said point of reference potential, means including said first power supply connecting said first collector and said point of reference potential, means including said second power supply connecting said second emitter and said point of reference potential, means connecting one terminal of said first power supply and said second collector, means to maintain a substantially constant voltage between said first collector and said second base, resistive means connecting said second base and one terminal of said second power supply, means to apply input signal to said first emitter, means to obtain an output signal from said second collector, and means providing signal and direct current negative feedback from said second collector to said first emitter.

2. A semiconductor amplifier circuit comprising a first transistor of one conductivity type connected in the common base configuration and including first base, collector, and emitter electrodes, a second transistor of similar conductivity type connected in the common emitter configuration and including second base, collector, and emitter electrodes, a point of reference potential, first and second direct current power supplies having output terminals, said first and second power supplies each having one terminal connected to said point of reference potential, means connecting said first base and said point of reference potential, means including a first resistor connecting the other terminal of said first power supply and said first collector, means connecting the other terminal of said second power supply and said second emitter, a second resistor connecting the said other terminal of said first power supply and said second collector, means to maintain a substantially constant voltage between said first collector and said second base, a third resistor connecting said second base and the said other terminal of said second power supply, means to apply input signal to said first emitter, means to obtain an output signal from said second collector, and means providing signal and direct current negative feedback from said second collector to said first emitter.

3. A semiconductor amplifier circuit comprising a first transistor of one conductivity type including first base, collector, and emitter electrodes, a second transistor of similar conductivity type including second base, collector, and emitter electrodes, a point of reference potential, first and second direct current power supplies having output terminals, said first and second power supplies each having one terminal connected to said point of reference potential, means connecting said first base and said point of reference potential, means including a first resistor connecting the other terminal of said first power supply and said first collector, means connecting the other terminal of said second power supply and said second emitter, a second resistor connecting the said other terminal of said first power supply and said second collector, means to maintain a substantially constant voltage between said first collector and said second base, a third resistor connecting said second base and the said other terminal of said second power supply, means to apply input signal to said first emitter, a utilization circuit connected between said second collector and said point of reference potential, and means providing signal and direct current negative feedback from said second collector to said first emitter.

4. A semiconductor amplifier circuit comprising a first transistor of one conductivity type including first base, collector, and emitter electrodes, a second transistor of similar conductivity type including second base, collector, and emitter electrodes, a ground reference, first and second direct current power supplies having output terminals, said first and second power supplies each having one terminal connected to ground, means connecting said first base to ground, a first resistor connecting the other terminal of said first power supply and said first collector, means connecting the other terminal of said second power supply and said second emitter, a second resistor connecting the said other terminal of said first power supply and said second collector, a Zener diode and a capacitor in shunt therewith connected between said first collector and said second base, a third resistor connecting said second base and the said other terminal of said second power supply, a coupling capacitor serving to apply input signal to said first emitter, means to obtain an output signal from said second collector, and a fourth resistor connected between said second collector and said first emitter.

5. A semiconductor amplifier circuit comprising a first transistor of one conductivity type including first base, collector, and emitter electrodes, a second transistor of similar conductivity type including second base, collector, and emitter electrodes, a ground reference, first and second direct current power supplies having output terminals, said first and second power supplies each having one terminal connected to ground, means connecting said first base to ground, a first resistor connecting the other terminal of said first power supply and said first collector, means connecting the other terminal of said second power supply and said second emitter, a second resistor connecting the said other terminal of said first power supply and said second collector, a Zener diode and a capacitor in shunt therewith connected between said first collector and said second base, a third resistor connecting said second base and the said other terminal of said second power supply, a coupling capacitor serving to apply input signal to said first emitter, a utilization circuit connected between said second collector and ground, and a fourth resistor connected between said second collector and said first emitter.

6. A semiconductor amplifier circuit comprising first and second transistors, each having emitter, base and collector electrodes, sources of bias current for the first and second transistors, the total bias current from said sources being equal to the bias current in the second transistor, the first transistor being connected in the common base configuration, the second transistor being connected in the common emitter configuration, means to maintain a substantially constant voltage difference between the base electrode of the second transistor and the collector electrode of the first transistor, means to derive an output signal from the collector electrode of the second transistor, means to apply signal to the emitter-base junction of the first transistor, and a feed-back path connecting the collector electrode of the second transistor and the emitter electrode of the first transistor.

7. A semiconductor amplifier circuit comprising first and second transistors of similar conductivity types, each having emitter, base and collector electrodes, means including first and second power supplies to provide bias current for the first and second transistors, the total bias current from the first and second power supplies being equal to the bias current in the second transistor, the first transistor being connected in the common base configuration, the second transistor being connected in the common emitter configuration, means to maintain a substantially constant voltage difference between the base electrode of the second transistor, and the collector electrode of the first transistor, means to derive an output signal from the collector electrode of the second transistor, means to apply signal to the emitter-base junction of the first transistor, and a feed-back path connecting the collector electrode of the second transistor and the emitter electrode of the first transistor.

8. A semiconductor amplifier circuit comprising first and second transistors of similar conductivity types, each having emitter, base and collector electrodes, serially connected first and second power supplies, a source of reference potential connected to the common terminal of the first and second power supplies, means including the first and second power supplies to provide bias current for the first and second transistors, the total bias current from the first and second power supplies being equal to the bias current in the second transistor, the base electrode of the first transistor being connected to the source of reference potential, the second power supply connecting the emitter electrode of the second transistor and the source of reference potential, an element providing a substantially constant voltage drop connecting the base electrode of the second transistor and the collector electrode of the first transistor, means to derive an output signal from the collector electrode of the second transistor, signal conducting means to apply signal to the emitter-base junction of the first transistor, and a signal and direct current feed-back path connecting the collector electrode of the second transistor and the emitter electrode of the first transistor.

9. A semiconductor amplifier circuit comprising first and second transistors of similar conductivity types, each having emitter, base and collector electrodes, serially connected first and second power supplies, a source of reference potential connected to the common terminal of the first and second power supplies, a first resistor connecting the collector electrode of the first transistor and the first power supply to provide bias current for the first transistor, a second resistor connecting the collector electrode of the second transistor and the first power supply to provide a first part of the bias current for the second transistor, the base electrode of the first transistor being connected to the source of reference potential, the second power supply connecting the emitter electrode of the second transistor and the source of reference, an element having a substantially constant voltage drop connecting the base electrode of the second transistor and the collector electrode of the first transistor, means to derive an output signal from the collector electrode of the second transistor, signal conducting means to apply signal to the emitter-base junction of the first transistor, and a signal and direct current feed-back path connecting the collector electrode of the second transistor and the emitter electrode of the first transistor to provide a second part of the bias current for the second transistor, the total bias current from the first and second power supplies being equal to the first and second parts of the bias current in the second transistor.

References Cited in the file of this patent

UNITED STATES PATENTS

| | | |
|---|---|---|
| 2,714,702 | Shockley | Aug. 2, 1955 |
| 2,900,456 | Davidson | Aug. 18, 1959 |

OTHER REFERENCES

Shea: Principles of Transistor Circuits, copyright 1953, pages 179 and 349–351.